United States Patent [19]

Kosai

[11] Patent Number: 5,731,621
[45] Date of Patent: Mar. 24, 1998

[54] THREE BAND AND FOUR BAND MULTISPECTRAL STRUCTURES HAVING TWO SIMULTANEOUS SIGNAL OUTPUTS

[75] Inventor: Kenneth Kosai, Goleta, Calif.

[73] Assignee: Santa Barbara Research Center, Goleta, Calif.

[21] Appl. No.: 618,136

[22] Filed: Mar. 19, 1996

[51] Int. Cl.$^6$ ............... H01L 31/00; H01L 31/101
[52] U.S. Cl. ............... 257/440; 257/184; 257/188; 257/443; 257/448; 250/370.14; 250/339.02; 250/338.4
[58] Field of Search ............... 257/201, 188, 257/190, 184, 440, 441, 442, 448, 444, 443; 250/370.14, 339.02, 338.4

[56] References Cited

U.S. PATENT DOCUMENTS

| | | | |
|---|---|---|---|
| 4,582,952 | 4/1986 | McNeely et al. | 136/249 |
| 4,753,684 | 6/1988 | Ondris et al. | 136/258 |
| 4,847,489 | 7/1989 | Dietrich | 250/226 |
| 5,059,786 | 10/1991 | Chu | 250/338.4 |
| 5,113,076 | 5/1992 | Schulte | 250/370.06 |
| 5,149,956 | 9/1992 | Norton | 250/211 |
| 5,380,669 | 1/1995 | Norton | 437/5 |
| 5,457,331 | 10/1995 | Kosai et al. | 257/188 |
| 5,581,084 | 12/1996 | Chapman et al. | 250/338.4 |

FOREIGN PATENT DOCUMENTS

| | | |
|---|---|---|
| 55-101832A | 8/1980 | Japan . |
| 2 255 227 | 10/1992 | United Kingdom . |

OTHER PUBLICATIONS

"Infinite-Melt Vertical Liquid-Phase Epitaxy OF HgCdTe FROM Hg Solution: Status and Prospects". Journal of Crystal Growth 86 (1988) 161-172, North-Holand, Amsterdam.

"Some Properties Of Photovoltaic $Cd_xHgl-_xTe$ Detectors For Infrared Radiation". J.M. Pawlikowski and P. Becla, Jan. 1975.

"HgCdTe dual-band infrared photodiodes grown by molecular beam epitaxy", J.M. Arias, M. Zandian, G. M. Williams, E.R. Blazejewski, R.E. DeWames, and J.G. Pasko, J. Appl. Phys. 70(8), 15 Oct. 1991.

Primary Examiner—Jerome Jackson
Attorney, Agent, or Firm—W. C. Schubert; W. K. Denson-Low

[57] ABSTRACT

A solid state array has a plurality of radiation detector unit cells, wherein each unit cell includes a bias-selectable two color photodetector in combination with either a second bias-selectable two color detector (10, 11) or a single photodetector (10', 11'). Each unit cell is thus capable of simultaneously outputting charge carriers resulting from the absorption of electromagnetic radiation within two spectral bands that are selected from one of four spectral bands and three spectral bands.

19 Claims, 6 Drawing Sheets

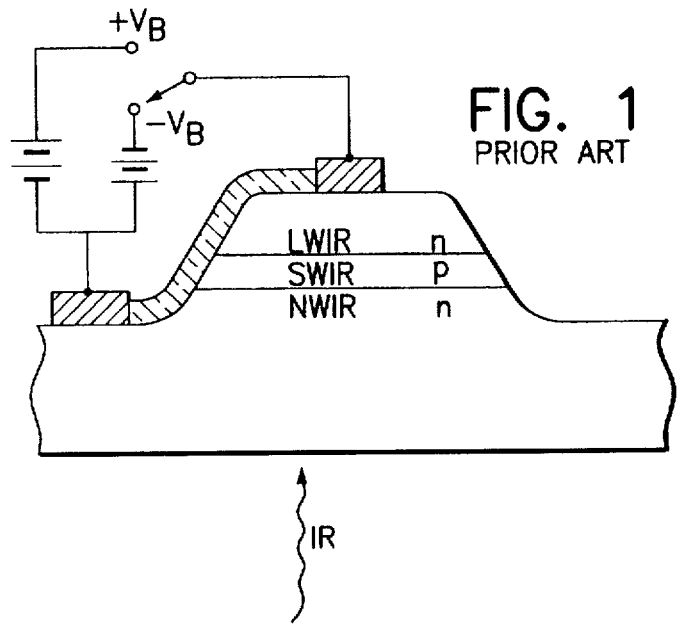
FIG. 1
PRIOR ART
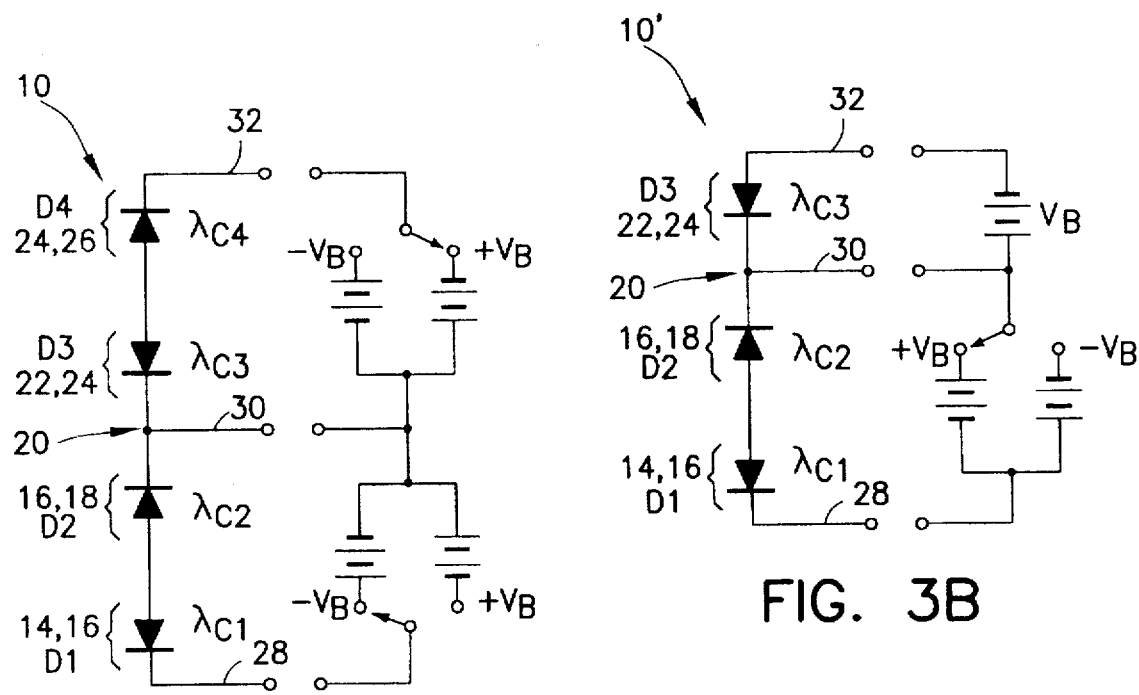
FIG. 3A
FIG. 3B

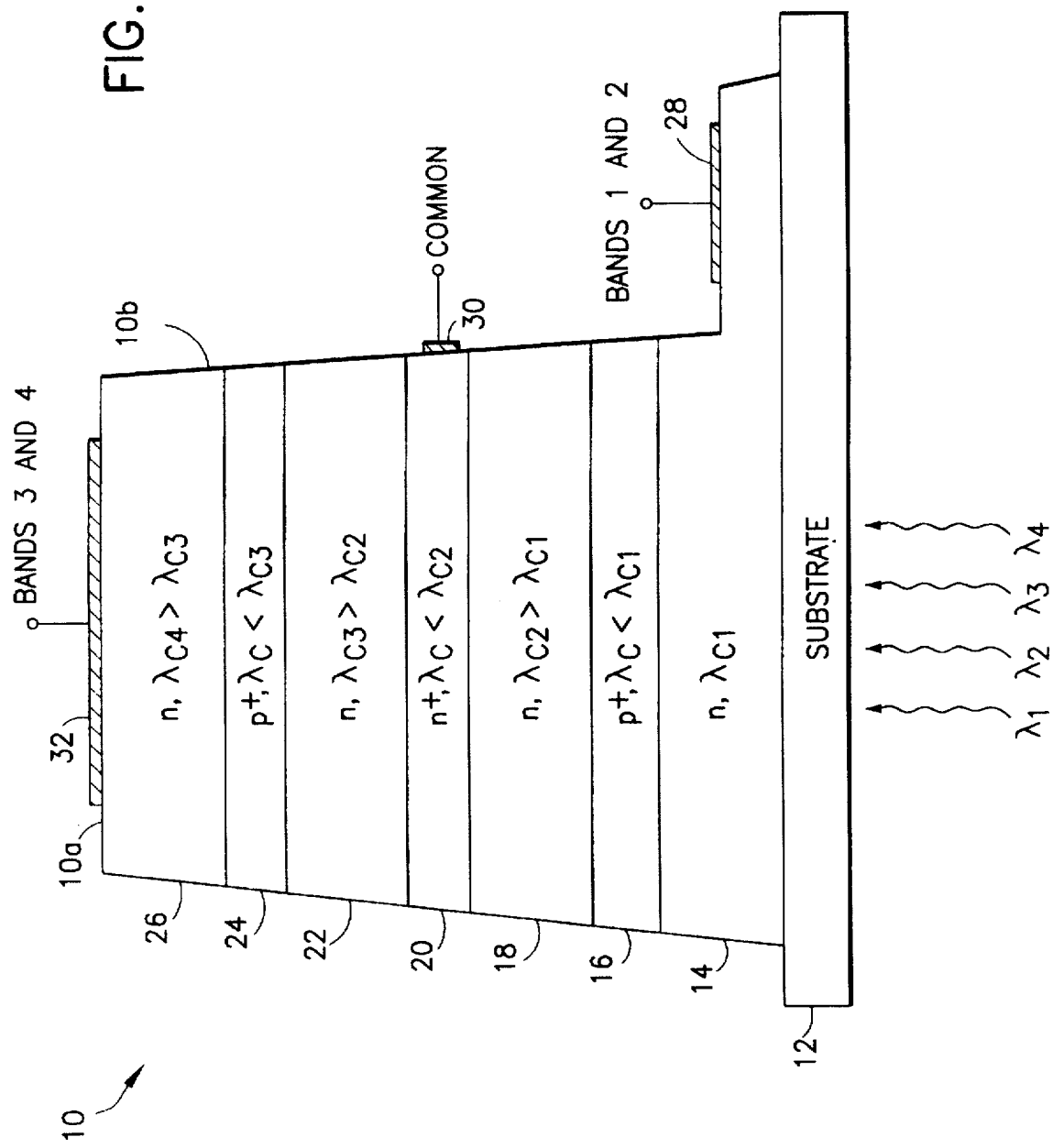

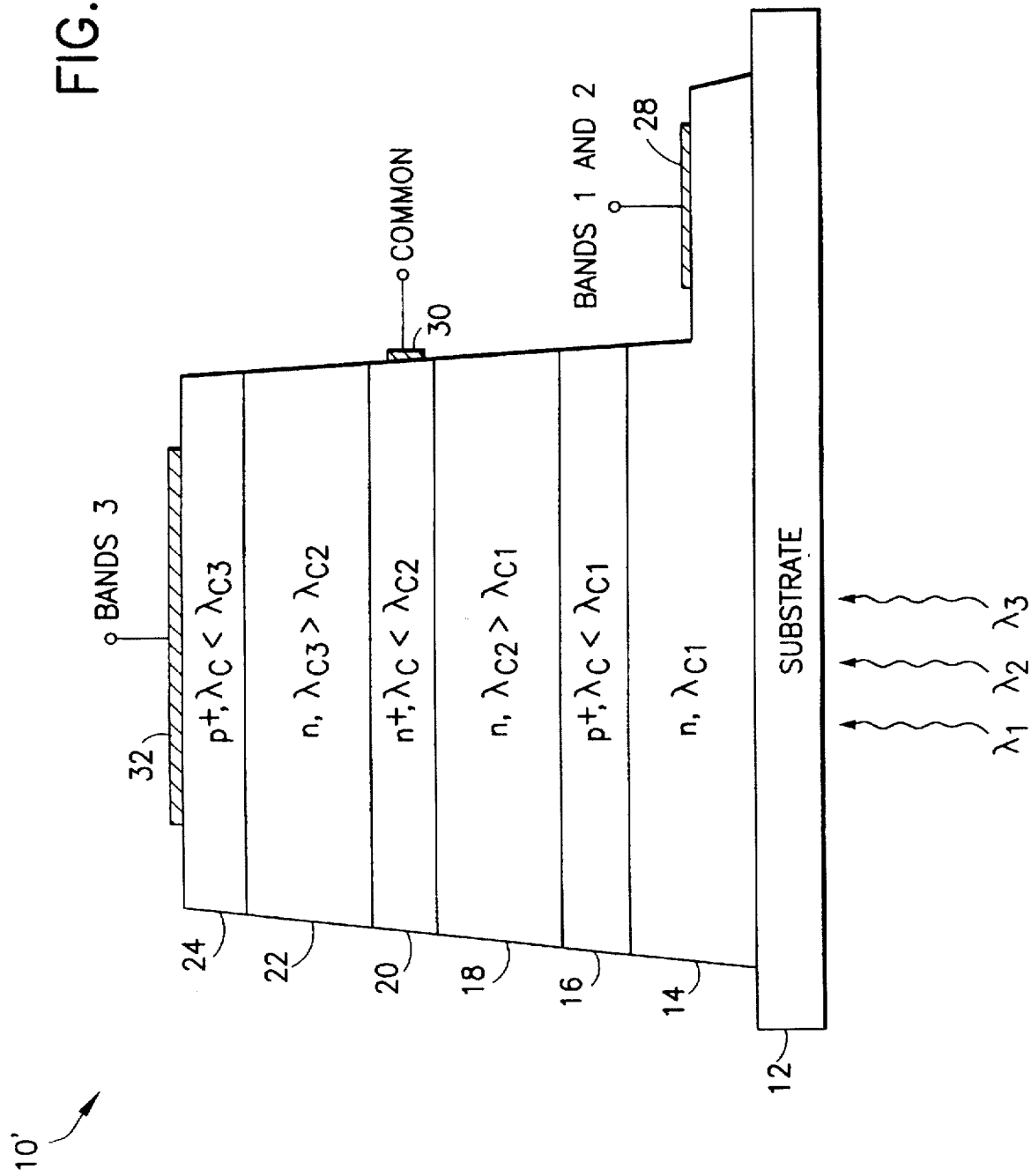

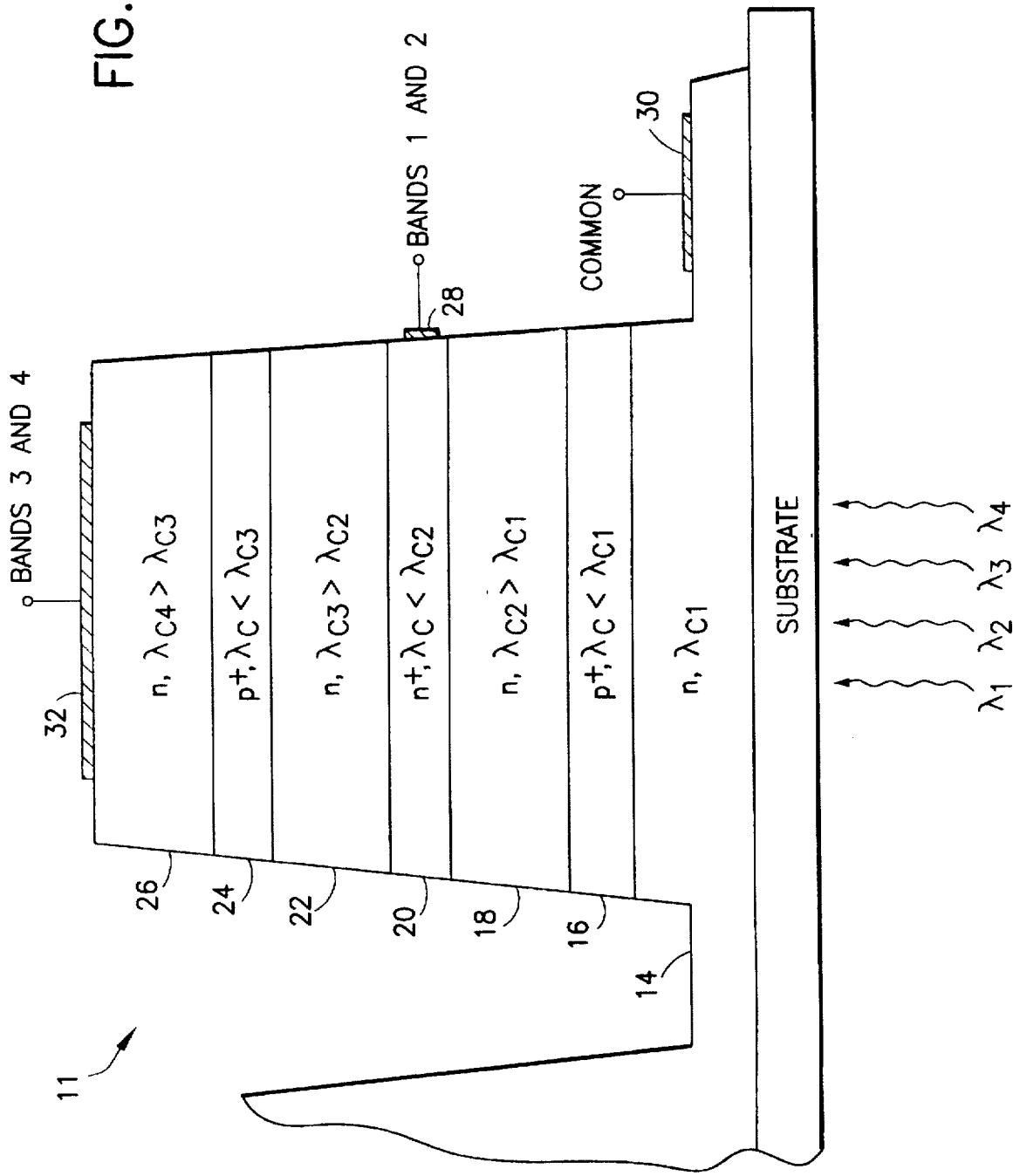

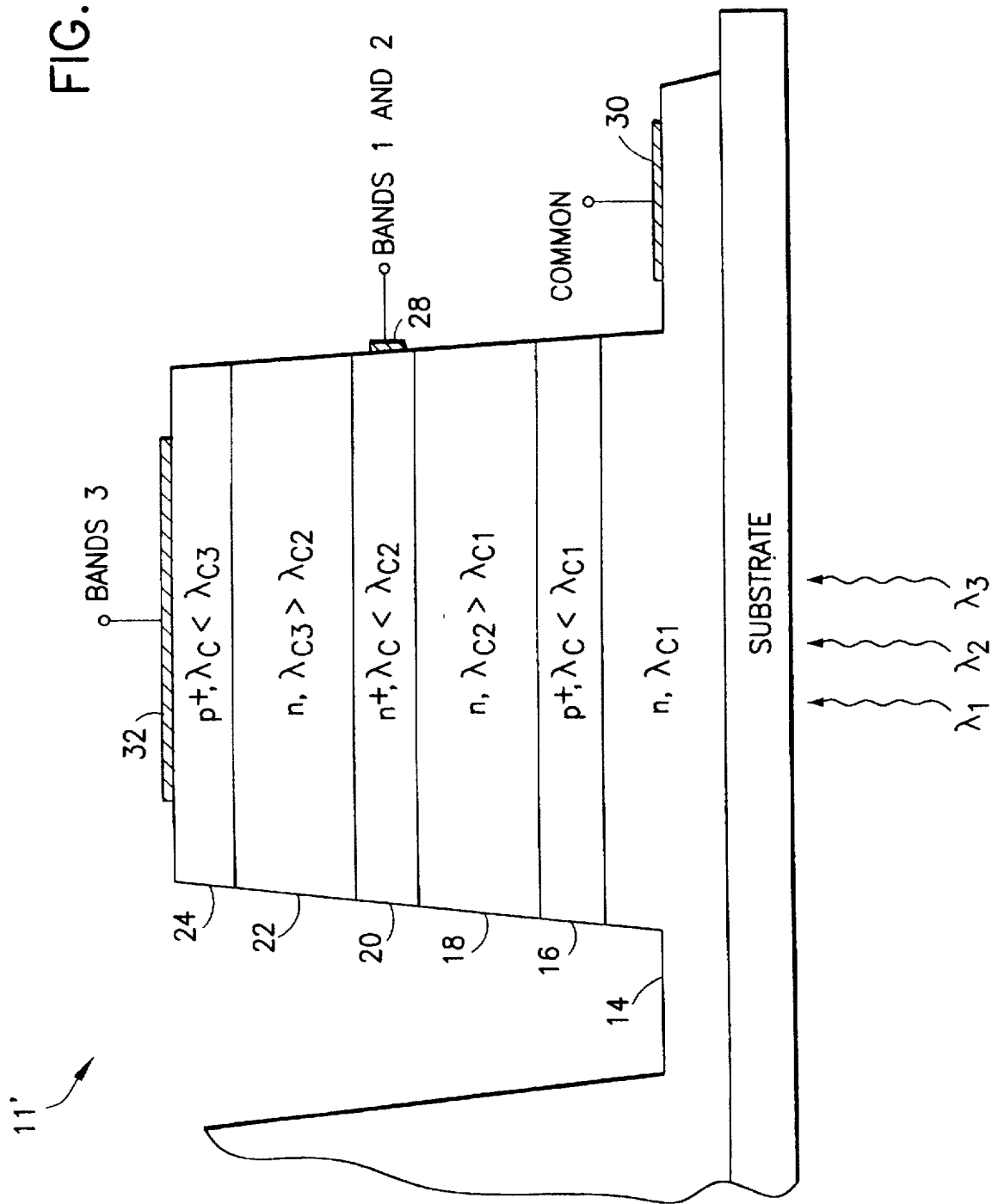

THREE BAND AND FOUR BAND MULTISPECTRAL STRUCTURES HAVING TWO SIMULTANEOUS SIGNAL OUTPUTS

FIELD OF THE INVENTION

This invention relates generally to solid state radiation detectors and, in particular, to radiation detectors that are sensitive to radiation within a plurality of spectral bands or "colors".

BACKGROUND OF THE INVENTION

A desirable type of photodetector is a two-color infrared radiation (IR) detector having simultaneous sensitivity in two spectral bands. The spectral bands may include short wavelength IR (SWIR), medium wavelength IR (MWIR), long wavelength IR (LWIR), and very long wavelength IR (VLWIR). An array of two color IR detectors may be employed in a number of imaging applications wherein it is required to simultaneously detect radiation within two spectral bands from a scene within a field of view of the array. By example, the array may be responsive to LWIR and MWIR, or to LWIR and SWIR.

FIG. 1 illustrates a two-color detector of type similar to that disclosed in commonly assigned U.S. Pat. No. 5,113,076, issued May 12, 1992, entitled "Two Terminal Multiband Infrared Radiation Detector" to E. F. Schulte. This commonly assigned patent discloses a radiation detector having two heterojunctions that function in a manner analogous to two back-to-back photodiodes. Each of the photodiodes is responsive to radiation within a different IR spectral band, such as LWIR and MWIR. Detection of a particular wavelength band is achieved by switching a bias supply. Disclosed configurations include an n-p-n configuration, a p-n-p configuration, and a p-n-p-n configuration.

Reference is also made to commonly assigned U.S. Pat. No. 5,149,956, issued Sep. 22, 1992, entitled "Two-Color Radiation Detector Array and Methods of Fabricating Same", by P. R. Norton. This patent describes the formation of a substantially continuous common layer between semiconductor regions responsive to different wavelength bands (e.g., MWIR and LWIR). A contact 28 is made to the common layer for coupling same to readout electronics.

Reference is also made to commonly assigned U.S. Pat. No. 5,380,669, issued Jan. 10, 1995, entitled "Method of Fabricating a Two-Color Radiation Detector Using LPE Crystal Growth", by P. R. Norton. This patent describes the use of Liquid Phase Epitaxy (LPE) to grow an n-type LWIR layer, a p-type MWIR layer, and an n-type MWIR layer on a sacrificial substrate. A passivation layer is then formed over the n-type MWIR layer, an IR transparent substrate is bonded to the passivation layer, and the sacrificial substrate is then removed. The resulting structure is then further processed to form an array of two-color detectors.

Further in this regard reference can be had to commonly assigned U.S. Pat. No. 5,457,331, issued Oct. 10, 1995, entitled "Dual Band Infrared Radiation Detector Optimized for Fabrication in Compositionally Graded HgCdTe", by K. Kosai and G. R. Chapman.

Reference can also be made to the n-p+-n dual-band detector described by J. M. Arias et al. in the Journal of Applied Physics, 70(8), 15 Oct. 1991, pps. 4820–4822. In this triple-layer n-p+-n structure MWIR absorption occurs in the bottom n-type layer, and LWIR absorption occurs in the top n-type layer.

In U.S. Pat. No. 4,847,489, Jul. 11, 1989, entitled "Light Sensitive Superlattice Detector Arrangement with Spectral Sensitivity" Dietrich discloses a detector arrangement comprising a plurality of photosensitive detector elements. Each of the detector elements has a multilayer structure of alternating positively and negatively doped photosensitive semiconductor material having a superlattice structure. A control voltage is said to control spectral light sensitivity, and an optical filter arrangement is provided for dividing the photodetectors into an upper and lower effective spectral range group.

In U.S. Pat. No. 4,753,684, Jun. 28, 1988, "Photovoltaic Heterojunction Structures" Ondris et al. describe a three layer, double heterojunction Group II–VI photovoltaic structure.

In Japanese Patent No. 55-101832, Aug. 4, 1980, Makoto Itou discloses, in the Abstract, an infrared detector comprised of n-type HgCdTe having electrodes 2 and 3 arranged on opposite surfaces. A polarity of a bias voltage is switchably coupled to the electrodes 2 and 3. This device is said to enable rays of wide wavelength ranges to be detected by only one semiconductor detector.

General information regarding IR-responsive materials may be found in an article entitled "HgCdTe and Related Alloys", D. Long and J. L. Schmit, Semiconductors and Semimetals, Vol. 5, IR Detectors, Academic Press 1970.

An article entitled "Some Properties of Photovoltaic $Cd_xHg_{1-x}Te$ Detectors for Infrared Radiation", by J. M. Pawlikowski and P. Becla, Infrared Physics, Vol. 15 (1975) pp. 331–337 describes photovoltaic p-n junction detectors constructed of HgCdTe crystals and epitaxial films. The authors report that the position of a photosensitivity maximum is shifted within a spectral region of 1–9 microns by changing a molar fraction of cadmium.

Optical sensors that are responsive to three or more wavelengths have conventionally required beamsplitters and separate optics for each band of wavelengths. However, the use of these addition components increases the mass, volume, complexity, and cost of the optical sensor.

It has been proposed to fabricate a detector responsive to more than two spectral bands by adding an additional detector or detectors on a side of a transparent substrate (e.g., a CdZnTe substrate) opposite to which a first two color detector is fabricated. However, this approach would clearly result in a significant complication of the layer growth and detector fabrication processes, and would also significantly complicate the required connections to a readout integrated circuit in a Focal Plane Array (FPA) embodiment.

OBJECTS OF THE INVENTION

It is an object of this invention to provide an improved multi-color IR detector and an array comprised of same.

It is another object of this invention to provide a three color or a four color IR detector array that is compatible with existing semiconductor processing methodologies.

It is a further object of this invention to provide a three color or a four color IR detector array that is compatible with existing readout integrated circuit architectures.

SUMMARY OF THE INVENTION

The foregoing objects of the invention are realized by an array comprised of a plurality of radiation detector unit cells, wherein each unit cell includes a bias-selectable two color detector in combination with a second bias-selectable two color detector or a single photodetector. Each unit cell is thus capable of simultaneously outputting charge carriers resulting from the absorption of electromagnetic radiation within two spectral bands selected from either four or three bands.

A radiation detector that is responsive to electromagnetic radiation within a plurality of spectral bands includes a multilayered semiconductor structure forming a first two color bias-selectable photodetector comprised of a first photoresponsive diode having a first terminal electrically coupled in series with a first terminal of a second photoresponsive diode. The first photoresponsive diode is responsive to electromagnetic radiation within a first predetermined band of wavelengths and the second photoresponsive diode is responsive to electromagnetic radiation within a second predetermined band of wavelengths.

The multilayered semiconductor structure further forms at least one further photodetector having at least one further photoresponsive diode having a first terminal coupled in series with a second terminal of the second photoresponsive diode. The at least one further photoresponsive diode is responsive to electromagnetic radiation within a third predetermined band of wavelengths.

The unit cells in accordance with this invention are three terminal devices, and a first electrical contact is conductively coupled to the second terminal of the first photoresponsive diode; a second electrical contact is conductively coupled to the second terminal of the second photoresponsive diode and to the first terminal of the further photoresponsive diode; and a third electrical contact is conductively coupled to a second terminal of the further photoresponsive diode.

One of the layers prevents photocarriers generated in the second photoresponsive diode from being collected by the at least one further photoresponsive diode, and also prevents photocarriers generated in the at least one further photodiode from being collected by the second photoresponsive diode. The layer is interposed between the first terminal of the at least one further photodiode and the second terminal of the second photoresponsive diode.

BRIEF DESCRIPTION OF THE DRAWINGS

The above set forth and other features of the invention are made more apparent in the ensuing Detailed Description of the Invention, when read in conjunction with the attached Drawings, wherein:

FIG. 1 is a cross-sectional view, not to scale, of a prior art dual-band (two-color) IR detector;

FIG. 2A is a cross-sectional view, not to scale, of a first embodiment of a four color IR detector array in accordance with this invention;

FIG. 2B is a cross-sectional view, not to scale, of a first embodiment of a three color IR detector array in accordance with this invention;

FIGS. 3A and 3B are schematic diagrams for the four color and the three color IR detector structures, respectively, of FIGS. 2A and 2B, respectively, in accordance with this invention;

FIG. 4A is a cross-sectional view, not to scale, of a second embodiment of a four color IR detector array in accordance with this invention;

FIG. 4B is a cross-sectional view, not to scale, of a second embodiment of a three color IR detector array in accordance with this invention.

DETAILED DESCRIPTION OF THE INVENTION

Figure 5A:
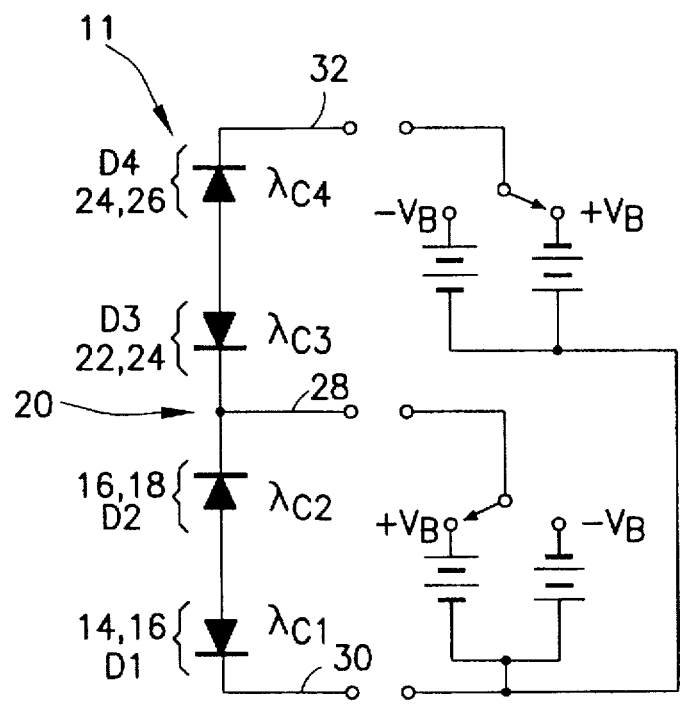
FIGS. 5A and 5B are schematic diagrams for the four color and the three color IR detector structures, respectively, of FIGS. 4A and 4B, respectively, in accordance with this invention.

The disclosures of the above-referenced commonly assigned U.S. Pat. Nos. 5,113,076, 5,149,956, 5,380,669, and 5,457,331 are incorporated by reference herein in their entireties, in so far as they do not conflict with the teaching of this invention.

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

The radiation detectors disclosed herein may be fabricated by Liquid Phase Epitaxy (LPE). Suitable LPE growth techniques are described in the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburgh, Pa., 1987), p.321; and T. Tung, Infinite-Melt Vertical Liquid-Phase Epitaxy of HgCdTe from Hg Solution: Status and Prospects, J. Crystal Growth 86 (1988), pps. 161–172.

It is preferred, however, to employ Molecular Beam Epitaxy (MBE) to fabricate the detector structures. This is due at least in part to the reduced layer thicknesses that can be achieved with MBE relative to LPE. By example, layer thickness reductions of approximately 20% to 40% can be realized with MBE, as compared to LPE.

The use of the MBE or the LPE growth techniques should not, however, be read as a limitation upon the practice of this invention.

Reference is now made to FIGS. 2A and 3A for showing a first embodiment of a four color IR-responsive radiation detector 10 in accordance with this invention. The detector 10 occupies a radiation detector unit cell area and comprises four photodetectors D1–D4. The various layer thicknesses described below are for the LPE-grown case. If MBE is employed then the layer thicknesses may be reduced accordingly. A detector array is comprised of a plurality of such photodetector unit cells, each of which defines a detector site or pixel. The enlarged cross-sectional view of FIG. 2A is of a four color detector that corresponds to the schematic diagram of FIG. 3A. Modifications to this structure to obtain the first embodiment of the three color detector of FIGS. 2B and 3B are described below.

The detector 10 is formed over a transparent substrate 12 (transparent at wavelengths $\lambda_1$–$\lambda_4$ of interest), e.g., a Group II–VI material such CdZnTe. The substrate 12 can also be comprised of a material other than a Group II–VI material, such as a Group IV material, such as Si, or a Group III–V material, such as GaAs. Over a surface of the substrate 12 is grown an n-type first color ($\lambda_{c1}$) responsive radiation absorbing layer 14. Layer 14 has a thickness in a range of, by example, 8–10 micrometers and is doped n-type with, by example, indium at a concentration of approximately $3 \times 10^{15}$ atoms/cm$^3$. Overlying the first layer 14 is a p$^+$ layer 16 having an energy bandgap giving it a cutoff wavelength $\lambda_c$ that is less than $\lambda_{c1}$. Layer 16 has a thickness in a range of, by example, 3–4 micrometers and is doped p-type with, by example, arsenic. Overlying the layer 16 is an n-type second color ($\lambda_{c2}$, wherein $\lambda_{c2} > \lambda_{c1}$) responsive radiation absorbing layer 18. Layer 18 has a thickness in a range of 8–10 micrometers and is doped n-type with, by example, indium at a concentration of approximately $3 \times 10^{15}$ atoms/cm$^3$. Overlying the layer 18 is an n$^+$ layer 20 having an energy bandgap giving it a cut-off wavelength $\lambda_c$ that is less than $\lambda_{c2}$. Layer 20 has a thickness in a range of 3–4 micrometers and is n-type. Overlying the layer 20 is an n-type third color ($\lambda_{c3}$, wherein $\lambda_{c3} > \lambda_{c2}$) responsive radiation absorbing layer 22. Layer 22 has a thickness in a range of 8–10 micrometers and is doped n-type with, by example, indium at a concentration of approximately $3 \times 10^{15}$ atoms/cm$^3$. Overlying the layer 22 is a p$^+$ layer 24 having an energy bandgap giving it a cut-off wavelength $\lambda_c$ that is less than $\lambda_{c3}$. Layer 24 also has a thickness in a range of 3–4 micrometers and is doped p-type with, by example, arsenic. Overlying the layer 24 is an n-type fourth color ($\lambda_{c4}$, wherein $\lambda_{c4} > \lambda_{c3}$) responsive radiation absorbing layer 26. Layer 26 has a thickness comparable to that of the layers 14, 18 and 22 and is doped n-type with, by example, indium at a concentration of approximately $3 \times 10^{15}$ atoms/cm$^3$.

It is pointed out the foregoing layer thicknesses, dopant types, and dopant concentrations are exemplary, and are not to be construed in a limiting sense upon the practice of the teaching of this invention.

In the embodiment of FIG. 2A the multi-layered structure is differentiated with orthogonally disposed trenches to form a plurality of mesa structures, and the optically active volume of each detector 10 is contained within one of the mesa structures. The mesa structure has a top surface 10a and downwardly sloping sidewalls 10b that terminate at the surface of the substrate 12.

Contact metalization or terminals 28, 30, and 32, in combination with a suitable interconnect system such as indium bumps (not shown), are provided for coupling the mesa structure to external biasing and read-out electronics which, in a FPA array embodiment, will typically be a readout integrated circuit. The use of well-known indium bump interconnects enables the array to be subsequently hybridized with the associated readout integrated circuit by cold-welding the indium bumps to corresponding indium bumps on a surface of the readout integrated circuit. Techniques for hybridizing radiation detector arrays to readout integrated circuits are known in the art.

In this embodiment the n$^+$ layer 20 functions as an electrically common layer, and further functions as a wide-bandgap barrier layer that separates minority carriers generated in the third (cutoff $\lambda_{c2}$) and fifth (cutoff $\lambda_{c3}$) layers and guides them to the proper collecting p-n junction. That is, photocarriers generated in the layer 18 are inhibited from crossing into the layer 22, and are instead collected by the p-n junction at the interface between the layers 18/16. In like manner, photocarriers generated in the layer 22 are inhibited from crossing into the layer 18, and are instead collected by the p-n junction at the interface between the layers 22/24.

An electrically insulating dielectric layer, preferably a wide-bandgap passivation layer, such as a layer of CdTe, can be applied over exposed surfaces 10a and 10b of the mesa structures. The passivation layer beneficially reduces surface states and improves the signal-to-noise ratio of the detector 10.

Suitable bias arrangements for the embodiment shown in FIGS. 2A and 3A are terminal 32 being biased at ±50 mV with respect to terminal 30, and terminal 28 being biased at ±50 mV with respect to terminal 30. By example, if terminal 32 is positive with respect to terminal 30, which in turn is positive with respect to terminal 28, then a photocurrent induced by $\lambda_{c4}$ can be obtained at terminal 32, a photocurrent induced by $\lambda_{c2}$ can be obtained at terminal 28, and a photocurrent representing a difference between $\lambda_{c4}$ and $\lambda_{c2}$ can be obtained at terminal 30. If terminal 30 is made negative with respect to terminal 28, then a photocurrent representing a sum of $\lambda_{c4}$ and $\lambda_{c1}$ can be obtained at terminal 30.

Referring now to the three photodetector (D1–D3) 10' embodiment of FIGS. 2B and 3B, it can be noticed that the structure is substantially identical to that of the four photodetector embodiment of FIG. 2A. The most significant exception is that the layer 26 is not provided, and the terminal 32 is electrically coupled to the layer 24.

It should be noted that the upper photodiode (layers 22 and 24) could be reversed (i.e., the anode could be adjacent to the common layer 20), by reversing the order of the n and p$^+$ layers 22 and 24. In this case the common terminal 30 is connected to both layers 20 and 22.

The resulting multispectral device structures are capable of detection in three bands (FIG. 3B) or four bands (FIG. 3A). In essence, a bias-switched, two-terminal, two color detector structure is provided (layers 14–18), and on top of this structure is placed either a third photodiode (FIG. 3B), or a second bias-switched two color detector (FIG. 3A). The polarity of the bias potentials ($+V_B, -V_B$) selects the spectral sensitivities of the device, because only the reverse-biased p-n junction collects photogenerated carriers. The four color detector 10 thus operates as two independent bias-selectable devices that occupy a same FPA unit cell. In the three color detector 10' of FIG. 3B only the bottom detector structure has a bias-selectable spectral sensitivity.

It should be noted that the third photodiode in the embodiment FIG. 3B, and also the second two color detector of FIG. 3A, are separated from the underlying bias switched two color detector by the wider bandgap common layer 20.

It should further be noted that both detectors 10 and 10' require only two indium bumps within each pixel (for terminals 28 and 32 in FIG. 3A and terminals 28 and 32 of FIG. 3B), and are thus compatible with conventional readout circuit architectures. The common terminal 30 can be coupled to metalization that is located within and runs though the array, with electrical contact being made at one or more locations at the periphery of the array (and thence away from the optically active area).

In the three color detector 10' of FIG. 3B the common terminal is terminal 30, the third band output current is always available at terminal 32, while at terminal 28 either the first band or the second band photocurrent is selected by appropriately changing the relative bias between terminals 28 and 30. In the four color photodetector 10 of FIG. 3A, the signal at terminal 32 can be switched between the third and fourth bands by changing the bias at terminal 32 relative to terminal 30.

Figure 5B:
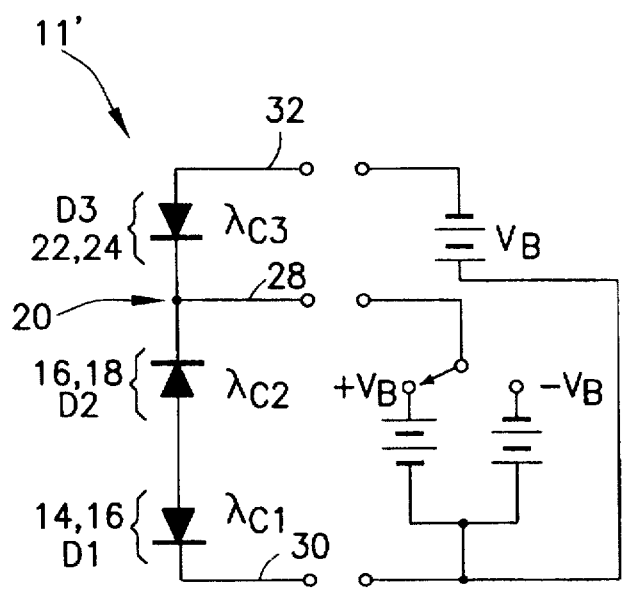

Reference is now made to FIGS. 4A, 4B, 5A and 5B for illustrating second embodiments of the four color and three color detectors, designated 11 and 11', respectively. In the embodiments of FIGS. 4A and 4B the multi-layered structure is differentiated with orthogonally disposed trenches to form the plurality of mesa structures. In this case each mesa structure has downwardly sloping sidewalls that terminate in the n-type layer 14, instead of at the surface of the substrate 12. The terminals 28 and 30 are also rearranged such that the common terminal 30 is coupled to the n-type layer 14, which then forms a common contact layer for all of the photodetectors of the array. Referring also to FIGS. 5A and 5B, the bias sources are now referenced to the common contact layer 14. In all other significant respects the photodetectors 11 and 11' are identical to the photodetectors 10 and 10' of FIGS. 2A and 2B, respectively. One advantage to the structures shown in FIGS. 4A and 4B is that generally larger arrays (i.e., more photodetectors) can be fabricated than for the embodiments of FIGS. 2A and 2B.

It is noted that, when switching the bias supply applied to terminal 28, a corresponding bias change is made at terminal 32 in order to maintain a relatively constant bias potential between terminals 28 and 32.

The photodetectors 10, 10', 11 and 11' can be constructed to be responsive to a number of combinations of wavelength bands, such as SWIR/MWIR/LWIR/VLWIR (photodetectors 10 and 11), SWIR/MWIR/LWIR (photodetectors 10' and 11'), and $MWIR_1/MWIR_2/VLWIR$, wherein $MWIR_1$ includes a wavelength in the range of, by example, 4000 nm to 5000 nm, and where $MWIR_2$ includes a wavelength in the range of, by example, 6000 nm to 7000 nm.

The arrangement of the radiation absorbing layers in these various embodiments is such that the incident radiation first encounters the wider bandgap semiconductor material, and that the bandgap of the succeeding layers becomes narrower.

It should be realized that the various material types, dimensions, and thicknesses are exemplary, and should not be read in a limiting sense upon the practice of the teaching of this invention. Also, the conductivity types of the various layers can be reversed and the bias potentials adjusted accordingly.

Thus, while the invention has been particularly shown and described with respect to preferred embodiments thereof, it will be understood by those skilled in the art that changes in form and details may be made therein without departing from the scope and spirit of the invention.

What is claimed is:

1. A radiation detector that is responsive to electromagnetic radiation within a plurality of spectral bands, comprising:

a multilayered semiconductor structure forming a first two color photodetector comprised of a first photoresponsive diode having a first terminal electrically coupled in series with a first terminal of a second photoresponsive diode, said first photoresponsive diode being responsive to electromagnetic radiation within a first predetermined band of wavelengths and said second photoresponsive diode being responsive to electromagnetic radiation within a second predetermined band of wavelengths;

said multilayered semiconductor structure further forming at least one further photodetector having at least one further photoresponsive diode having a first terminal coupled in series with a second terminal of said second photoresponsive diode, said at least one further photoresponsive diode being responsive to electromagnetic radiation within a third predetermined band of wavelengths;

a first electrical contact that is conductively coupled to a second terminal of said first photoresponsive diode;

a second electrical contact that is conductively coupled to said second terminal of said second photoresponsive diode and to said first terminal of said further photoresponsive diode through a contact and minority carrier barrier layer; and a third electrical contact that is conductively coupled to a second terminal of said further photoresponsive diode.

2. A radiation detector as set forth in claim 1, wherein said first electrical contact is conductively coupled to a cathode of said first photoresponsive diode, and wherein said second electrical contact is conductively coupled to a cathode of said second photoresponsive diode.

3. A radiation detector as set forth in claim 1, wherein said contact and minority carrier barrier layer isolates photocarriers generated in said second photoresponsive diode from being collected by said at least one further photoresponsive diode, said contact and minority carrier barrier layer further isolating photocarriers generated in said at least one further photodiode from being collected by said second photoresponsive diode, said contact and minority carrier barrier layer being interposed between said first terminal of said at least one further photodiode and said second terminal of said second photoresponsive diode.

4. A solid state array comprised of a plurality of infrared radiation detector unit cells, individual ones of said radiation detector unit cells being a three-terminal device and comprising a first bias-switched photoresponsive diode pair coupled in series with a second bias-switched photoresponsive diode pair, a first one of said photoresponsive diode pairs capable of being selectively biased for generating charge carriers representing electromagnetic radiation within one of a first and second predetermined range of wavelengths simultaneously with a second one of said photoresponsive diode pairs being selectively biased for generating charge carriers representing electromagnetic radiation within one of a third and fourth predetermined range of wavelengths.

5. A solid state array comprised of a plurality of infrared radiation detector unit cells, individual ones of said radiation detector unit cells being a three-terminal device and comprising a bias-switched photoresponsive diode pair coupled in series with a third photoresponsive diode, said photoresponsive diode pair capable of being selectively biased for generating charge carriers representing electromagnetic radiation within one of a first and second predetermined range of wavelengths simultaneously with said third photoresponsive diode being selectively biased, as a function of the selective biasing of said photoresponsive diode pair, for generating charge carriers representing electromagnetic radiation within a third predetermined range of wavelengths.

6. An array comprised of a plurality of radiation detectors, individual ones of said radiation detectors comprising:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band, said third layer forming a second p-n junction photoresponsive diode with said second layer;

a fourth layer overlying said third layer, said fourth layer being comprised of Group II–VI semiconductor material and functioning as a contact and minority carrier barrier layer;

9 a fifth layer overlying said fourth layer, said fifth layer being comprised of Group II–VI semiconductor material, said fifth layer having one of the first type of electrical conductivity, and a bandgap selected for absorbing radiation within a third spectral band, and the second type of electrical conductivity;

a sixth layer overlying said fifth layer, said sixth layer being comprised of Group II–VI semiconductor material, said sixth layer having an opposite type of electrical conductivity from said fifth layer for forming a third p-n junction photo-responsive diode with said fifth layer, said sixth layer, when having said first type of electrical conductivity, also having a bandgap selected for absorbing radiation within the third spectral band; and a first electrical contact coupled to said first layer, a second electrical contact coupled to said fourth layer, and a third electrical contact coupled to said sixth layer;

wherein said fourth layer has a bandgap selected for passing radiation within the third spectral band.

7. An array of radiation detectors as set forth in claim 6, and further comprising a substrate having a first surface underlying a surface of said first layer, said substrate being selected from a material that is substantially transparent to electromagnetic radiation within said first, second and third spectral bands.

8. An array comprised of a plurality of radiation detectors, individual ones of said radiation detectors comprising:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band, said third layer forming a second p-n junction photoresponsive diode with said second layer;

a fourth layer overlying said third layer, said fourth layer being comprised of Group II–VI semiconductor material and functioning as a contact and minority carrier barrier layer;

a fifth layer overlying said fourth layer, said fifth layer being comprised of Group II–VI semiconductor material, said fifth layer having the first type of electrical conductivity and a bandgap selected for absorbing radiation within a third spectral band;

a sixth layer overlying said fifth layer, said sixth layer being comprised of Group II–VI semiconductor material, said second layer having the second type of electrical conductivity that is opposite the first type of electrical conductivity for forming a third p-n junction photo-responsive diode with said fifth layer;

a seventh layer overlying said sixth layer, said seventh layer being comprised of Group II–VI semiconductor material, said seventh layer having the first type of electrical conductivity and a bandgap selected for absorbing radiation within a fourth spectral band, said

10 seventh layer forming a fourth p-n junction photo-responsive diode with said sixth layer;

a first electrical contact coupled to said first layer, a second electrical contact coupled to said fourth layer, and a third electrical contact coupled to said seventh layer;

wherein said fourth layer has a bandgap selected for passing radiation within the third and the fourth spectral bands.

9. An array of radiation detectors as set forth in claim 8, and further comprising a substrate having a first surface underlying a surface of said first layer, said substrate being selected from a material that is substantially transparent to electromagnetic radiation within said first, second, third and fourth spectral bands.

10. A solid state array comprised of a plurality of radiation detector unit cells, each said unit cell being a three terminal device comprising a bias-selectable two color photodetector in combination with one of a second bias-selectable two color detector and a single photodetector, each said unit cell being responsive to bias potentials for simultaneously outputting charge carriers resulting from an absorption of electromagnetic radiation within two spectral bands, said two spectral bands being selected from one of four spectral bands and three spectral bands.

11. A solid state array as set forth in claim 10, wherein individual ones of said radiation detector unit cells is comprised of:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band, said third layer forming a second p-n junction photoresponsive diode with said second layer;

a fourth layer overlying said third layer, said fourth layer being comprised of Group II–VI semiconductor material;

a fifth layer overlying said fourth layer, said fifth layer being comprised of Group II–VI semiconductor material, said fifth layer having one of the first type of electrical conductivity, and a bandgap selected for absorbing radiation within a third spectral band, and the second type of electrical conductivity;

a sixth layer overlying said fifth layer, said sixth layer being comprised of Group II–VI semiconductor material, said sixth layer having an opposite type of electrical conductivity from said fifth layer for forming a third p-n junction photo-responsive diode with said fifth layer, said sixth layer, when having said first type of electrical conductivity, also having a bandgap selected for absorbing radiation within the third spectral band; and a first electrical contact coupled to said first layer, a second electrical contact coupled to said fourth layer, and a third electrical contact coupled to said sixth layer;

wherein said fourth layer has a bandgap selected for passing radiation within the third spectral band and for inhibiting a conduction of charge carriers between said third and fifth layers.

12. A solid state array as set forth in claim 11, and further comprising a substrate having a first surface underlying a surface of said first layer, said substrate being selected from a material that is substantially transparent to electromagnetic radiation within said first, second and third spectral bands.

13. A solid state array as set forth in claim 11, wherein said first layer is electrically common with a plurality of said multispectral photodetectors.

14. A solid state array as set forth in claim 10, wherein individual ones of said radiation detector unit cells is comprised of:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band, said third layer forming a second p-n junction photoresponsive diode with said second layer;

a fourth layer overlying said third layer, said fourth layer being comprised of Group II—VI semiconductor material;

a fifth layer overlying said fourth layer, said fifth layer being comprised of Group II–VI semiconductor material, said fifth layer having the first type of electrical conductivity and a bandgap selected for absorbing radiation within a third spectral band;

a sixth layer overlying said fifth layer, said sixth layer being comprised of Group II–VI semiconductor material, said second layer having the second type of electrical conductivity that is opposite the first type of electrical conductivity for forming a third p-n junction photo-responsive diode with said fifth layer;

a seventh layer overlying said sixth layer, said seventh layer being comprised of Group II–VI semiconductor material, said seventh layer having the first type of electrical conductivity and a bandgap selected for absorbing radiation within a fourth spectral band, said seventh layer forming a fourth p-n junction photo-responsive diode with said sixth layer;

a first electrical contact coupled to said first layer, a second electrical contact coupled to said fourth layer, and a third electrical contact coupled to said seventh layer;

wherein said fourth layer has a bandgap selected for passing radiation within the third and the fourth spectral bands and for inhibiting a conduction of charge carriers between said third and fifth layers.

15. An array of radiation detectors as set forth in claim 14, and further comprising a substrate having a first surface underlying a surface of said first layer, said substrate being selected from a material that is substantially transparent to electromagnetic radiation within said first, second, third and fourth spectral bands.

16. A solid state array as set forth in claim 14, wherein said first layer is electrically common with a plurality of said multispectral photodetectors.

17. An array of radiation detectors as set forth in claim 10, wherein said spectral bands are selected from the group consisting essentially of Short Wavelength Infrared (SWIR) radiation, Medium Wavelength Infrared (MWIR) radiation, Long Wavelength Infrared (LWIR) radiation, and Very Long Wavelength Infrared (VLWIR) radiation.

18. A method of operating a solid state array comprised of a plurality of radiation detector unit cells, comprising the steps of:

providing in each said unit cell a three terminal radiation detector comprised of a bias-selectable two color photodetector in combination with one of a second bias-selectable two color detector and a single photodetector; and selectively applying bias potentials to said three terminal radiation detector for simultaneously outputting from said unit cell charge carriers resulting from an absorption of electromagnetic radiation within two spectral bands, said two spectral bands being selected from one of four spectral bands and three spectral bands.

19. A method as set forth in claim 18, wherein said spectral bands are selected from the group consisting essentially of Short Wavelength Infrared (SWIR) radiation, Medium Wavelength Infrared (MWIR) radiation, Long Wavelength Infrared (LWIR) radiation, and Very Long Wavelength Infrared (VLWIR) radiation.

* * * * *